(12) United States Patent
Kimbara et al.

(10) Patent No.: US 8,387,685 B2
(45) Date of Patent: Mar. 5, 2013

(54) HEAT SINK FOR POWER MODULE

(75) Inventors: Masahiko Kimbara, Kariya (JP); Keiji Toh, Kariya (JP); Hidehito Kubo, Kariya (JP); Katsufumi Tanaka, Kariya (JP); Kota Otoshi, Kariya (JP); Eiji Kono, Kariya (JP); Nobuhiro Wakabayashi, Oyama (JP); Shintaro Nakagawa, Oyama (JP); Yuichi Furukawa, Oyama (JP); Shinobu Yamauchi, Oyama (JP)

(73) Assignees: Kabushiki Kaisha Toshiba Jidoshokki, Aichi-Ken (JP); Showa Denko K.K., Tokyo (JP)

( * ) Notice: Subject to any disclaimer, the term of this patent is extended or adjusted under 35 U.S.C. 154(b) by 799 days.

(21) Appl. No.: 11/919,368

(22) PCT Filed: Apr. 19, 2006

(86) PCT No.: PCT/JP2006/308189
§ 371 (c)(1),
(2), (4) Date: Sep. 10, 2009

(87) PCT Pub. No.: WO2006/118032
PCT Pub. Date: Nov. 9, 2006

(65) Prior Publication Data
US 2009/0314474 A1 Dec. 24, 2009

(30) Foreign Application Priority Data
Apr. 27, 2005 (JP) ................. 2005-130251

(51) Int. Cl.
*F28F 7/00* (2006.01)
*F28F 3/12* (2006.01)

(52) U.S. Cl. ...................... 165/80.4; 165/169

(58) Field of Classification Search ............... 165/80.4, 165/104.33, 80.3, 169, 170; 361/698, 699; 257/714
See application file for complete search history.

(56) References Cited

U.S. PATENT DOCUMENTS 4,559,580 A * 12/1985 Lutfy ........................... 361/689
4,619,316 A * 10/1986 Nakayama et al. ...... 165/104.33
(Continued)

FOREIGN PATENT DOCUMENTS

JP 02-306097 12/1990
JP 6-326226 11/1994
(Continued)

OTHER PUBLICATIONS

International Search Report of PCT/JP2006/308189 (Completion Date: Aug. 1, 2006; Mailing Date: Aug. 8, 2006).
(Continued)

*Primary Examiner* — Tho V Duong
(74) *Attorney, Agent, or Firm* — Locke Lord LLP

(57) ABSTRACT

A heat sink for a power module able to realize a further improvement of heat radiating performance and a further improvement of a mounting property is provided.

The heat sink 1 for a power module has a laminating body 20, a first side plate 30 and a second side plate 40. The laminating body 20 has plural flow path plates 21 formed in a plate shape in which plural grooves 23 parallel to each other are concavely arranged on a flat joining face 22. Each groove 23 is set to a parallel flow path 50 parallel to a front face side by laminating each flow path plate 21 by each joining face 22. A portion other than each groove 23 of each joining face 22 forms a heat transfer path 70a to each parallel flow path 50 of a laminating direction. A flow-in path 30a and a flow-out path 40a are formed in the first and second side plates 30, 40. The flow-in path 30a and the flow-out path 40a are joined to side faces 26a, 26b of the laminating body 20, and are communicated with each parallel flow path 50. The flow-in path 30a flows a cooling medium into each parallel flow path 50. The flow-out path 40a flows the cooling medium out of each parallel flow path 50. A refrigerant flow path is constructed by the flow-in path 30a, each parallel flow path 50 and the flow-out path 40a.

6 Claims, 7 Drawing Sheets

U.S. PATENT DOCUMENTS

| | | | | |
|---|---|---|---|---|
| 4,956,746 | A | * | 9/1990 | Gates et al. .................... 361/699 |
| 5,088,005 | A | * | 2/1992 | Ciaccio .......................... 361/699 |
| 5,170,319 | A | * | 12/1992 | Chao-Fan Chu et al. ..... 361/689 |
| 5,423,376 | A | * | 6/1995 | Julien et al. ................... 165/80.4 |
| 5,437,328 | A | | 8/1995 | Simons |
| 5,737,186 | A | * | 4/1998 | Fuesser et al. ................ 361/699 |
| 6,014,312 | A | * | 1/2000 | Schulz-Harder et al. ..... 361/699 |
| 6,386,278 | B1 | * | 5/2002 | Schulz-Harder .............. 165/167 |
| 6,409,072 | B1 | | 6/2002 | Breuer et al. |
| 6,742,574 | B2 | * | 6/2004 | Sugito et al. ............. 165/104.21 |
| 6,843,308 | B1 | * | 1/2005 | Duval ...................... 165/104.26 |
| 6,865,081 | B2 | * | 3/2005 | Meyer et al. .................. 361/699 |
| 7,156,159 | B2 | * | 1/2007 | Lovette et al. ........... 165/104.33 |

FOREIGN PATENT DOCUMENTS

| | | |
|---|---|---|
| JP | 06-326226 | 11/1994 |
| JP | 7-7282 | 1/1995 |
| JP | 8-227953 A | 9/1996 |
| JP | 2004-128457 A | 4/2004 |

OTHER PUBLICATIONS

English translation of the International Preliminary Report on Patentability dated Nov. 8, 2007, Application No. PCT/JP2006/308189.
German Office Action dated Oct. 16, 2008, received in corresponding German Patent Application No. 11 2006 000 957.5-33 with English translation.

* cited by examiner

HEAT SINK FOR POWER MODULE

TECHNICAL FIELD

The present invention relates to a heat sink for a power module.

BACKGROUND ART

A conventional heat sink is disclosed in patent document 1. In this heat sink, a power device, such as a semiconductor chip, etc. is mounted on at least one face, and heat from the power device is radiated by a cooling medium circulated within a refrigerant flow path arranged in the interior.

This heat sink has two surface plates and a laminating body in which plural flow path plates are laminated and the laminating body is laminated together with the surface plate.

The plural flow path plates constituting the laminating body are formed in a plate shape in which a through hole is press-punch-processed within a flat joining face. Each of these flow path plates is laminated by each joining face so that a flow path communicated in a laminating direction is formed within the laminating body while each through hole is meandered and extended in parallel with the joining face, and plural columns are formed within the joining face.

One set or plural sets of flow-in holes and flow-out holes communicated with the flow path of the laminating body in the laminating direction are formed on at least one side of the surface plate. Piping is connected to each of the flow-in hole and the flow-out hole. A flow-in path is formed by the piping and the flow-in hole. A flow-out path is formed by the piping and the flow-out hole.

Thus, in this heat sink, the refrigerant flow path is constructed by the flow-in path, the flow path and the flow-out path.

In the conventional heat sink having such a construction, the power device is mounted to at least one side of the surface plate, and is set to a power module. In the heat sink for the power module, the cooling medium is flowed into the flow path from the piping through the flow-in hole, and is flowed out of the piping through the flow-out hole. In the meantime, the cooling medium radiates heat from the power device. The flowed-out cooling medium is cooled by a radiator, etc., and is then circulated.

Patent document 1: JP-A-2-306097

DISCLOSURE OF THE INVENTION

Problems that the Invention is to Solve

In recent years, a moving body such as a hybrid car, etc. with an electric motor as one portion of a driving source is being spread. In such a moving body, it is necessary to mount the power device of a high output to the power module so as to control electric power supplied to the electric motor, etc. in accordance with an operating situation. A further improvement of heat radiating performance is also required in the heat sink to radiate heat from this power device. Further, an improvement of a mounting property is also required in the heat sink to enlarge a riding space of the moving body.

In this respect, in the above conventional heat sink, the flow-in hole and the flow-out hole are formed on at least one side of the surface plate laminated together with the laminating body. Accordingly, the flow rate of the cooling medium is restricted to the flow-in hole and the flow-out hole. Namely, the flow path of this heat sink is formed such that the through hole is meandered and extended in parallel with the joining face and plural columns are formed within the joining face. Therefore, the inside diameter of the flow path itself is limited by the area of the joining face. Further, since the flow-in hole and the flow-out hole are communicated with the flow path of the laminating body in the laminating direction, the inside diameter is limited by the width of the flow path. Therefore, in this heat sink, it is difficult to greatly increase the flow rate of the cooling medium. As its result, it is difficult to further improve heat radiating performance.

Further, in the conventional heat sink, the power device must be mounted to the surface plate for forming the flow-in hole and the flow-out hole, and thickness is increased by the piping. Therefore, in this heat sink, it is difficult to thinly set the heat sink in the laminating direction. As its result, it is also difficult to further improve a mounting property.

The present invention is made in consideration of the above conventional real situation, and a problem to be solved is to provide a heat sink for a power module able to realize a further improvement of the heat radiating performance and a further improvement of the mounting property.

Means for Solving the Problems

The heat sink for a power module of the present invention is a heat sink for a power module in which a power device is mounted to at least one face, and heat from the power device is radiated by a cooling medium circulated within a refrigerant flow path arranged in the interior;

characterized in that the heat sink has:

a laminating body in which plural flow path plates formed in a plate shape and concavely arranging plural grooves parallel to each other on a flat joining face are arranged, and each groove is set to a parallel flow path parallel to the one face by laminating each flow path plate by each joining face, and a portion other than each groove of each joining face forms a heat transfer path to each parallel flow path of the laminating direction;

a first side plate joined to a side face of one end side of the laminating body and communicated with one end of each parallel flow path, and forming a flow-in path for flowing the cooling medium into each parallel flow path; and a second side plate joined to a side face of the other end side of the laminating body and communicated with the other end of each parallel flow path, and forming a flow-out path for flowing the cooling medium out of each parallel flow path; and the refrigerant flow path is constructed by the flow-in path, each parallel flow path and the flow-out path.

In the heat sink for a power module of the present invention, the power device is mounted to at least one face, and heat from the power device is radiated by the cooling medium circulated within the refrigerant flow path arranged in the interior. The heat sink has the laminating body, the first side plate and the second side plate.

In the laminating body, plural flow path plates of a plate shape are laminated. A face abutting on another flow path plate in laminating each flow path plate is set to a flat joining face. Plural grooves parallel to each other are concavely arranged on at least one joining face of each flow path plate. These grooves may be straight, a curved shape, meandered, etc. Further, a three-dimensional projection for promoting a turbulent flow may be also added. Each of the plural grooves mutually concavely arranged in parallel in each flow path plate is covered with the joining face of another flow path plate of a groove side, and many parallel flow paths are formed within the laminating body by laminating each of these flow path plates while each joining face is abutted. One end of each parallel flow path is formed on the side face of one end side of the laminating body, and the other end of each parallel flow path is formed on the side face of the other end side of the laminating body. These many parallel flow paths are formed so as to be overlapped in the laminating direction, and are also parallel to the above one face for mounting the power device.

Further, in this laminating body, a portion other than each groove of each joining face forms a heat transfer path to each parallel flow path of the laminating direction. Therefore, a heat transfer area of the heat transfer path is sufficiently secured in comparison with a case in which a corrugated fin, etc. are laminated within the refrigerant flow path of the heat sink while the corrugated fin, etc. are joined by a point or a line. With respect to the heat transfer path, for example, plural heat transfer paths straightly arranged from one face side to the other face side may be also aligned. Further, plural heat transfer paths may be also arranged in a radiating shape from the power device side mounted to the heat sink on one face side to the other face side. The heat transfer path may also have a branching heat transfer path branched from an intermediate portion.

The flow-in path is formed within the first side plate. An upstream end of this flow-in path can be formed on a face not joined to the laminating body. A downstream end of the flow-in path can be formed on a face joined to the side face of one end side of the laminating body. Therefore, the downstream end of the flow-in path is communicated with one end of each parallel flow path and the cooling medium can be flowed into each parallel flow path by joining the first side plate to the side face of one end side of the laminating body.

The flow-out path is formed within the second side plate. An upstream end of this flow-out path can be formed on a face joined to the side face of the other end side of the laminating body, and a downstream end of the flow-out path can be formed on a face not joined to the laminating body. Therefore, the upstream end of the flow-out path is communicated with the other end of each parallel flow path, and the cooling medium can be flowed out of each parallel flow path by joining the second side plate to the side face of the other end side of the laminating body.

The refrigerant flow path for circulating the cooling medium to radiate heat from the power device is constructed by the above flow-in path, each parallel flow path and the flow-out path.

In the heat sink for a power module of the present invention having such a construction, the power device is mounted to at least one face of the laminating body, and is set to the power module. For example, if this power module is applied to a moving body such as a hybrid car, etc. with an electric motor as one portion of a driving source, heat generated by the power device can be radiated as follows to control electric power supplied to the electric motor, etc. in accordance with an operating situation.

Namely, in this heat sink for a power module, the cooling medium is approximately simultaneously flowed into each one end of many parallel flow paths within the laminating body through the flow-in path formed in the first side plate. The cooling medium is then rapidly circulated within each parallel flow path, and reaches the other end of each parallel flow path, and is flowed out of the flow-out path formed in the second side plate. In the meantime, a portion other than each groove of each joining face forms a heat transfer path to each parallel flow path of the laminating direction. Accordingly, heat from the power device is sequentially transmitted to each parallel flow path of the laminating direction through this heat transfer path, and the cooling medium is heated. The flowed-out cooling medium is cooled by a radiator, etc., and is then circulated. Thus, the heat from the power device is radiated by the cooling medium.

Here, in the heat sink for a power module of the present invention, as mentioned above, the refrigerant flow path is constructed by the flow-in path communicated with one end of each parallel flow path, many parallel flow paths and the flow-out path communicated with the other end of each parallel flow path. Accordingly, the flow rate of the cooling medium circulated within the refrigerant flow path can be greatly increased. Therefore, in this heat sink for a power module, no flow rate of the cooling medium is easily restricted in comparison with the conventional heat sink in which the flow-in hole and the flow-out hole are formed on at least one side of the surface plate laminated together with the laminating body. Further, this heat sink for a power module has many parallel flow paths. Accordingly, the length of a path for receiving heat by the cooling medium in circulation within the refrigerant flow path can be also greatly shortened in comparison with the conventional heat sink. Further, in this heat sink for a power module, a portion other than each groove of each joining face forms the heat transfer path to each parallel flow path of the laminating direction. Accordingly, a heat transfer area of the heat transfer path is sufficiently secured, and heat generated by the power device can be efficiently transmitted to each parallel flow path. Therefore, this heat sink for a power module can further improve heat radiating performance.

Further, in this heat sink for a power module, the first side plate forming the flow-in path therein and the second side plate forming the flow-out path therein are joined to the side face of the laminating body. Accordingly, in comparison with the conventional heat sink in which the flow-in hole and the flow-out hole are formed in the surface plate, the heat sink is easily thinned in the laminating direction and no mounting place of the power device is easily restricted to the flow-in path and the flow-out path. Therefore, this heat sink for a power module can further improve a mounting property.

Accordingly, the heat sink for a power module of the present invention can realize the further improvement of the heat radiating performance and the further improvement of the mounting property.

The flow path plate can be constructed by an alloy of aluminum and copper. Further, the flow path plate can be constructed by ceramic of aluminum nitride, alumina, silicon nitride, silicon carbide (SiC), etc., a composite material (Al-SiC: Aluminum Silicon Carbide) of silicon carbide and an aluminum system metal, an invar alloy (an alloy having nickel and iron as a main component), a composite material of an invar alloy and an aluminum system metal, an alloy of copper and molybdenum, a composite material of copper oxide and copper, a metal impregnating carbon composite material (MICC: Metal Impregnated Carbon Composites), etc. The material of the flow path plate preferably has a good thermal conducting property from a view point of heat radiating performance. Further, with respect to the material of the flow path plate, a mounted insulating circuit substrate is constructed by a material of a comparatively small coefficient of linear thermal expansion from a view point of durability. Therefore, it is preferable to set the difference in thermal expansion between the flow path plate and the insulating circuit substrate to be small. Accordingly, the material of the flow path plate is preferably constructed by a material of a comparatively small coefficient of linear thermal expansion. The first side plate and the second side plate can be also constructed by the above material, etc. similarly to the flow path plate.

As a joining method for joining and setting each laminated flow path plate to the laminating body, it is preferable to select a joining method suitable for a material constituting the flow path plate, but adhesion, brazing, soldering, etc. can be selected.

In the heat sink for a power module of the present invention, the above heat transfer path is preferably formed so as to gradually reduce the heat transfer area from the above one face side.

In this case, in this heat sink for a power module, the section of each parallel flow path is formed so as to be gradually increased from one face side of the laminating body mounting the power device thereto to the other face side. Therefore, in this heat sink for a power module, heat generated by the power device can be efficiently radiated to the cooling medium by each parallel flow path gradually increased in section while this heat is efficiently transmitted from one face of the laminating body to the other face by the heat transfer path gradually reduced in the heat transfer area.

In the heat sink for a power module of the present invention, plural through holes passing through the bottom face of each groove and communicating each parallel flow path of the laminating direction can be formed in each flow path plate.

In this case, in this heat sink for a power module, while the cooling medium flowed from the flow-in path into each parallel flow path is moved to another parallel flow path, the cooling medium can be circulated within the refrigerant flow path. Therefore, this heat sink for a power module can further improve heat radiating performance.

In the heat sink for a power module of the present invention, each through hole is preferably shifted in the laminating direction.

In this case, in this heat sink for a power module, the movement of the cooling medium to another parallel flow path can be more effectively generated, and heat radiating performance can be further improved.

In the heat sink for a power module of the present invention, each through hole is preferably formed so as to guide the cooling medium in the laminating direction.

In this case, in this heat sink for a power module, the cooling medium can be moved from one face side of the laminating body to the other face side, or can be moved from the other face side to one face side. Accordingly, the difference in temperature between one face side and the other face side of the laminating body can be reduced. As its result, heat radiating performance can be further improved.

As a concrete example in which the through hole is formed so as to guide the cooling medium in the laminating direction, there are a structure for slantingly forming the through hole in a groove, a structure for setting one portion of an inner wall face to a slanting face, a structure for projecting one portion of an inner wall face into a groove, etc.

In the heat sink for a power module of the present invention, each flow path plate can be formed by at least press molding, cutting processing, extrusion molding or roll forming.

In this heat sink for a power module, manufacture cost can be reduced by adopting these methods.

Concretely, if a material constituting the flow path plate is aluminum, for example, the flow path plate can be continuously molded by extrusion molding. Further, if the material constituting the flow path plate is a ceramic system material, for example, press molding is performed at the stage of a green sheet and a groove is concavely arranged, and lamination and burning can be then executed.

In the heat sink for a power module of the present invention, the fin extending in the longitudinal direction is arranged within the groove. Further, a three-dimensional projection for promoting a turbulent flow may be also added into this groove.

In this case, in this heat sink for a power module, an area coming in contact with the cooling medium can be greatly increased by the fin arranged within the groove. Accordingly, heat radiating performance can be further improved.

Figure 1:
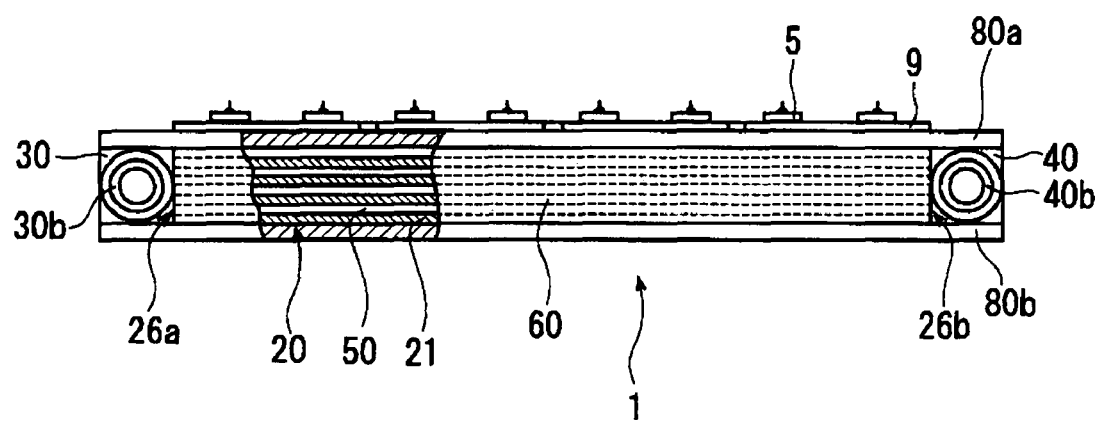
FIG. 1 is a schematic front view (partial sectional view) of a heat sink for a power module of embodiment 1.

DESCRIPTION OF THE REFERENCE NUMERALS AND SIGNS 1, 2 . . . heat sink for power module
5 . . . power device
21 . . . flow path plate
22 . . . joining face
23 . . . groove
24 . . . through hole
20, 20b, 20c, 20d . . . laminating body
26a . . . side face of one end side of laminating body
26b . . . side face of the other end side of laminating body
30 . . . first side plate
30a . . . flow-in path
40 . . . second side plate
40a . . . flow-out path
50 . . . parallel flow path
70a, 70b, 70c . . . heat transfer path
71 . . . fin

BEST MODE FOR CARRYING OUT THE INVENTION

Embodiments 1 to 5 for embodying the present invention will next be explained with reference to the drawings. In each figure, an upper side is set to a front face, and a lower side is set to a rear face. Further, arrows 70a, 70b, 70c of two-dotted chain lines described in sections of laminating bodies 20, 20b, 20c, 20d of FIGS. 5 to 8 respectively conceptually show heat transfer paths for transmitting heat generated by a power device 5 to each parallel flow path 50.

Embodiment 1

Figure 2:
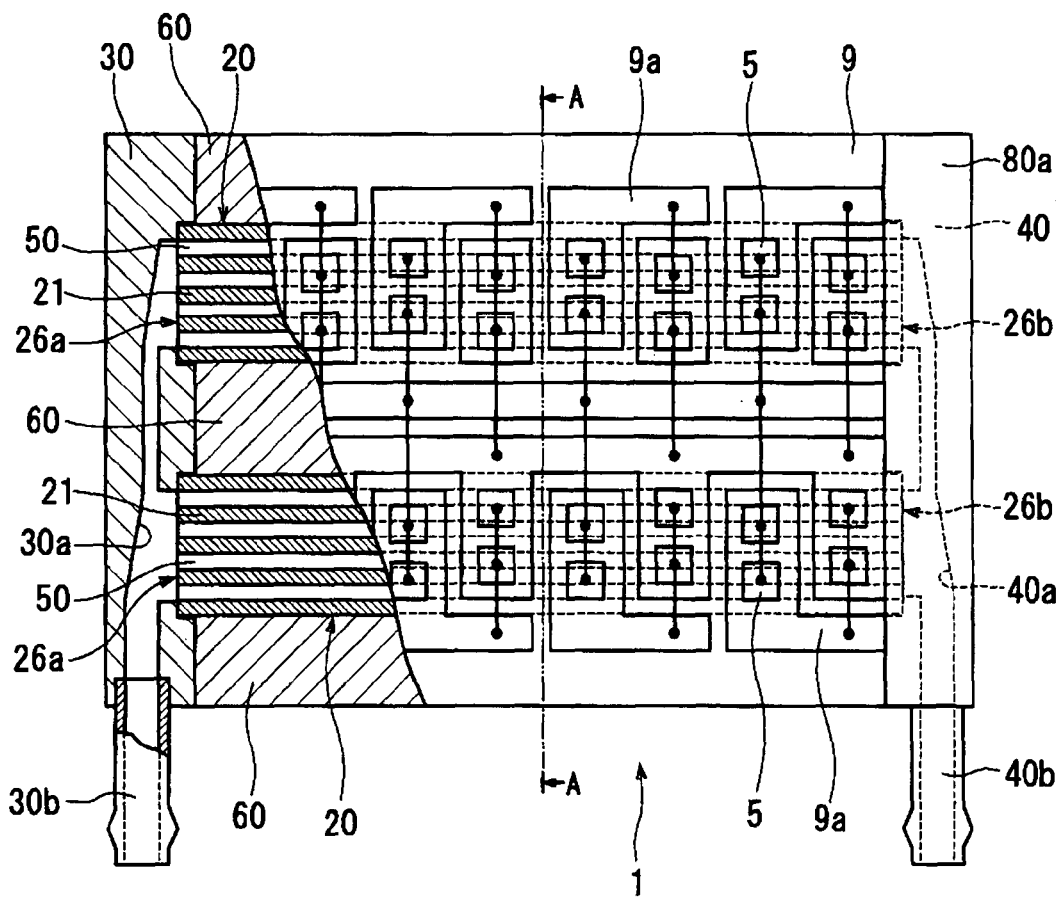
FIG. 2 is a schematic top view (partial sectional view) of the heat sink for a power module of embodiment 1.
Figure 3:
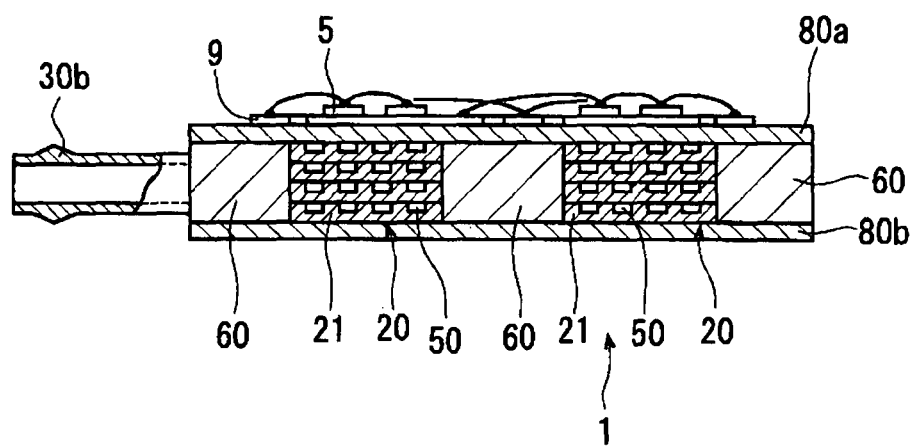
FIG. 3 is a schematic side view relating to the heat sink for a power module of embodiment 1, and showing section A-A of FIG. 2.

As shown in FIGS. 1 to 3, in a heat sink 1 for a power module of embodiment 1, the power device 5 is mounted to a front face side through an insulating circuit substrate 9. Heat from the power device 5 is radiated by a cooling medium circulated within a refrigerant flow path arranged in the interior. The heat sink 1 for a power module has a laminating body 20, a first side plate 30 and a second side plate 40.

Figure 4:
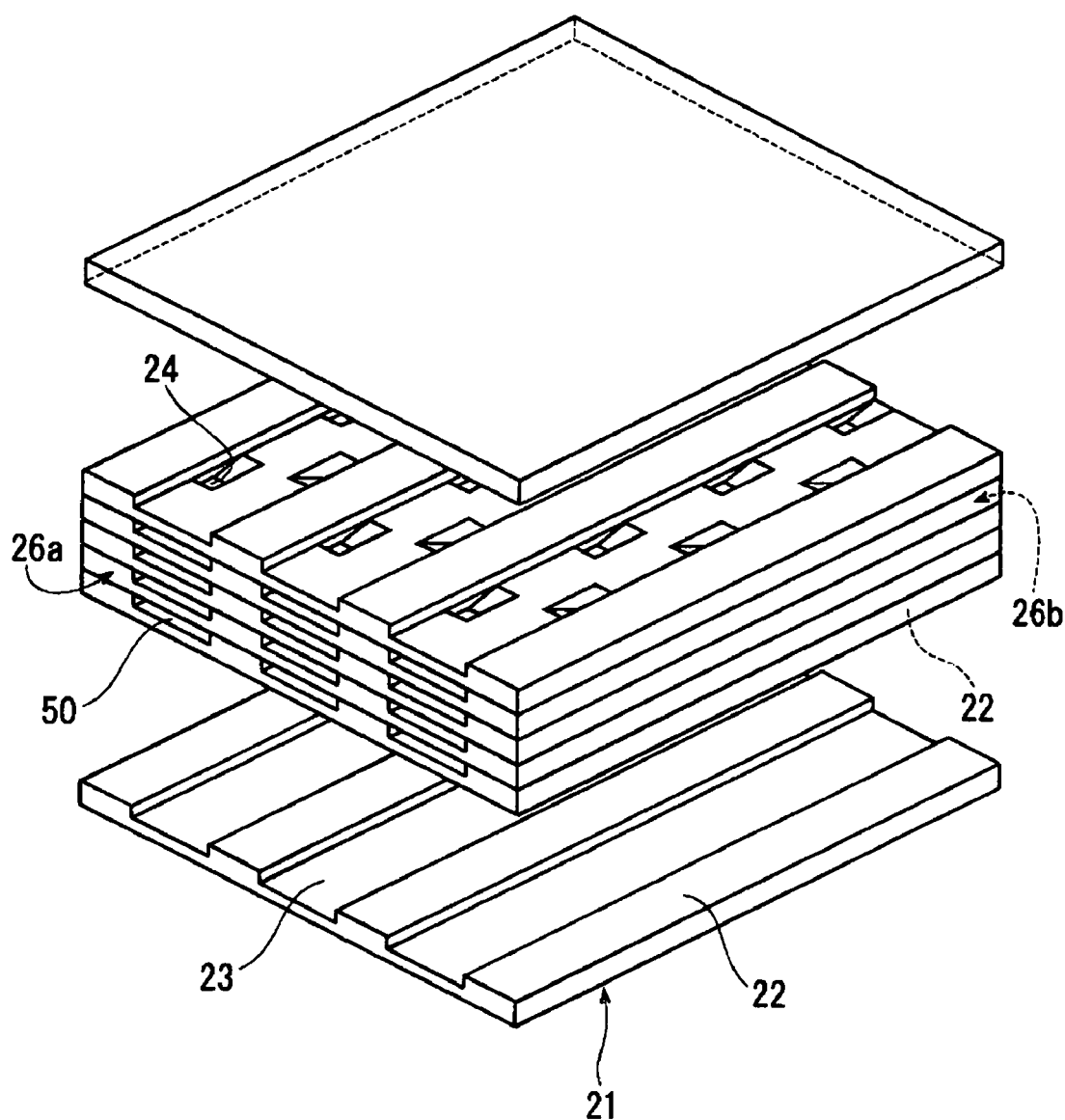
FIG. 4 is a schematic perspective view relating to the heat sink for a power module of embodiment 1, and showing a laminating body formed by laminating a flow path plate.

In the laminating body 20, as shown in FIG. 4, plural flow path plates 21 of a plate shape are laminated. Each flow path plate 21 is constructed by a material selected from aluminum nitride, an aluminum alloy, etc. A face abutting on another flow path plate 21 in laminating each flow path plate 21 is set to a flat joining face 22. Plural straight grooves 23 parallel to each other are concavely arranged on the joining face 22 of the front face side of each flow path plate 21.

As a method for concavely arranging the groove 23, press molding, cutting processing, extrusion molding or roll forming is adopted, which contributes to a reduction in manufacture cost. Concretely, when a material constituting the flow path plate is aluminum, a method for cutting the flow path plate to a predetermined length after the flow path plate is continuously molded by extrusion molding, etc. are adopted. Further, when the material constituting the flow path plate is a ceramic system material, a method for executing lamination and burning after extrusion molding is performed in a slurry state and a green sheet is manufactured or a groove is formed by processing in the green sheet of a flat plate, etc. are adopted.

Plural through holes 24 are formed in each groove 23. When each flow path plate 21 is set to the laminating body 20, these through holes 24 are formed in positions shifted in a laminating direction. Further, one portion of an inner wall face of the through hole 24 is set to a slanting face, and is formed so as to guide the cooling medium circulated in the through hole 24 in the laminating direction. Further, the direction of the slanting face of the through hole 24 is divided into a direction parallel to a parallel flow path 50 and the laminating direction by vector decomposition.

Each of the plural grooves 23 mutually concavely arranged in parallel in each flow path plate 21 is covered with the joining face 22 of another flow path plate 21 of the groove 23 side by laminating each of these flow path plates 21 while each joining face 22 is abutted. Many parallel flow paths 50 are then formed within the laminating body 20. In this case, as a method for joining each flow path plate 21, brazing, etc. are adopted if a material constituting each flow path plate 21 is aluminum nitride and an aluminum alloy. Further, one end of each parallel flow path 50 is formed on a side face 26a of one end side of the laminating body 20. The other end of each parallel flow path 50 is formed on a side face 26b of the other end side of the laminating body 20. These many parallel flow paths 50 are formed so as to be also overlapped in the laminating direction, and are also parallel to a surface for mounting the power device.

Figure 5:
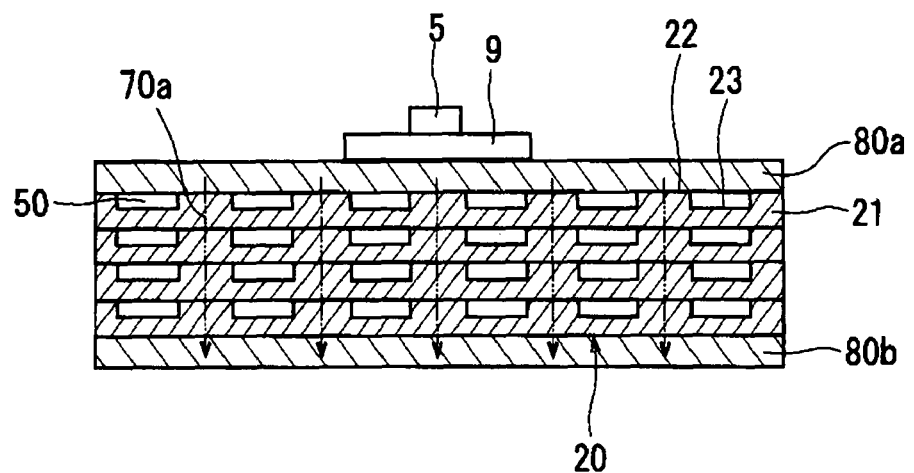
FIG. 5 is a typical sectional view of the laminating body relating to the heat sink for a power module of embodiment 1.

In the laminating body 20, as typically shown in FIG. 5, a portion other than each groove 23 of each joining face 22 forms a heat transfer path 70a to each parallel flow path of the laminating direction. Concretely, the portion other than each groove 23 of each joining face 22 is arranged so as to be aligned in a straight line shape from the front face side of the laminating body 20 to the rear face side, and is set to the heat transfer path 70a of plural columns. Therefore, a heat transfer area of the heat transfer path 70a is sufficiently secured in comparison with a case in which a corrugated fin, etc. are laminated within the refrigerant flow path of the heat sink while the corrugated fin, etc. are joined by a point or a line. It is sufficient to align the heat transfer path 70a in a straight line shape from the front face side of the laminating body 20 to the rear face side. The heat transfer path 70a is preferably aligned in a perpendicular direction shown in FIG. 5, but may be also aligned in a slanting direction.

With respect to the laminating body 20 having such a construction, in embodiment 1, two laminating bodies are arranged in parallel, and a spacer block 60 is arranged therebetween and on both sides. Surface plates 80a, 80b are overlapped on the front face side and the rear face side of the two laminating bodies 20. The first side plate 30 and the second side plate 40 described later are abutted on the side face 26a of one end side of the laminating body 20 and the side face 26b of the other end side. Thereafter, all of these are integrated by a joining method of brazing, etc., and are set to the heat sink 1 for a power module of embodiment 1.

A flow-in path 30a is formed within the first side plate 30. An upstream end of this flow-in path 30a is formed on a face not joined to the laminating body 20, and a flow-in hole 30b is mounted. The flow-in hole 30b is arranged so as to be projected in a side face direction of the laminating body 20, and a direction perpendicular to the parallel flow path 50. On the other hand, a downstream end of the flow-in path 30a is formed on a face joined to the side face 26a of one end side of the laminating body 20. In the heat sink 1 for a power module of embodiment 1, the downstream end of the flow-in path 30a is forked into two branches to arrange the two laminating bodies 20. Thus, the downstream end of the flow-in path 30a is communicated with one end of each parallel flow path 50, and the cooling medium can be flowed into each parallel flow path 50 by joining the first side plate 30 having such a construction to the side face 26a of one end side of the laminating body 20.

A flow-out path 40a is formed within the second side plate 40. An upstream end of this flow-out path 40a is formed on a face joined to the side face 26b of the other end side of the laminating body 20. Similar to the downstream end of the flow-in path 30a, the upstream end of the flow-out path 40a is forked into two branches. On the other hand, a downstream end of the flow-out path 40a is formed on a face not joined to the laminating body 20, and a flow-out hole 40b is mounted. This flow-out hole 40b is arranged so as to be projected in a side face direction of the laminating body 20, and a direction perpendicular to the parallel flow path 50. Therefore, the upstream end of the flow-out path 40a is communicated with the other end of each parallel flow path 50 and the cooling medium can be flowed out of each parallel flow path 50 by joining the second side plate 40 to the side face 26b of the other end side of the laminating body 20.

A refrigerant flow path for circulating the cooling medium to radiate heat from the power device 5 is constructed by the above flow-in hole 30b, flow-in path 30a, each parallel flow path 50, flow-out path 40a and flow-out hole 40b.

In the heat sink 1 for a power module of embodiment 1 having such a construction, the power device 5 is mounted to the surface of the laminating body 20 through the insulating circuit substrate 9 and is set to the power module. In this case, the power device 5 is wired to a wiring layer 9a of the surface of the insulating circuit substrate 9 by wire bonding, etc. For example, if this power module is applied to a moving body such as a hybrid car, etc. with an electric motor as one portion of a driving source, heat generated by the power device 5 can be radiated as mentioned below to control electric power supplied to the electric motor, etc. in accordance with an operating situation.

Namely, in this heat sink 1 for a power module, the cooling medium is approximately simultaneously flowed into each one end of many parallel flow paths 50 within the laminating body 20 through the flow-in path 30a formed in the first side plate 30. The cooling medium is then rapidly circulated within each parallel flow path 50 and reaches the other end of each parallel flow path 50, and is flowed out of the flow-out path 40a formed in the second side plate 40. In the meantime, a portion other than each groove 23 of each joining face 22 forms the heat transfer path 70a to each parallel flow path 50 of the laminating direction. Accordingly, heat from the power device 5 is sequentially transmitted to each parallel flow path 50 of the laminating direction through this heat transfer path 70a, and the cooling medium is heated. The flowed-out cooling medium is cooled by an unillustrated radiator, etc., and is then circulated. Thus, the heat from the power device 5 is radiated by the cooling medium.

Here, in the heat sink 5 for a power module of embodiment 1, the refrigerant flow path is constructed by the flow-in hole 30b, the flow-in path 30a communicated with one end of each parallel flow path 50, many parallel flow paths 50, the flow-out path 40a communicated with the other end of each parallel flow path 50, and the flow-out hole 40b constructed above. Accordingly, the flow rate of the cooling medium circulated within the refrigerant flow path can be greatly increased. Therefore, in this heat sink 1 for a power module, no flow rate of the cooling medium is easily restricted in comparison with the conventional heat sink in which the flow-in hole and the flow-out hole are formed on at least one side of the surface plate laminated together with the laminating body 20. Further, since this heat sink 1 for a power module has many parallel flow paths 50, the length of a path for receiving heat by the cooling medium in circulation within the refrigerant flow path can be also greatly shortened in comparison with the conventional heat sink. Further, in this heat sink 1 for a power module, a portion other than each groove 23 of each joining face 22 forms the heat transfer path 70a to each parallel flow path 50 of the laminating direction. Accordingly, a heat transfer area of the heat transfer path 70a is sufficiently secured, and heat generated by the power device 5 can be efficiently transmitted to each parallel flow path 50. Therefore, this heat sink 1 for a power module can further improve heat radiating performance.

Further, in this heat sink 1 for a power module, the first side plate 30 forming the flow-in path 30a therein and the second side plate 40 forming the flow-out path 40a therein are joined to the side faces 26a, 26b of the laminating body 20. The flow-in hole 30b and the flow-out hole 40b are arranged so as to be projected in a side face direction of the laminating body 20, and a direction perpendicular to the parallel flow path 50. Accordingly, in comparison with the conventional heat sink in which the flow-in hole and the flow-out hole are formed in the surface plate, the heat sink 1 is easily thinned in the laminating direction and no mounting place of the power device 5 is easily restricted. Therefore, this heat sink 1 for a power module can further improve a mounting property.

Accordingly, the heat sink 1 for a power module of embodiment 1 can realize the further improvement of the heat radiating performance and the further improvement of the mounting property.

Further, in this heat sink 1 for a power module, plural through holes 24 passing through a bottom face of each groove 23 and communicating each parallel flow path 50 of the laminating direction are formed in each parallel flow path 50. Each of these through holes 24 is shifted in the laminating direction, and is formed so as to guide the cooling medium in the laminating direction. Therefore, in this heat sink 1 for a power module, the cooling medium flowed into each parallel flow path 50 from the flow-in path 30a can be circulated while this cooling medium is moved to a separate parallel flow path 50. If it is seen in the entire laminating body 20, this is that the cooling medium can be moved from the front face side of the laminating body 20 to the rear face side, or can be moved from the rear face side to the front face side. As its result, the difference in temperature between the front face side and the rear face side of the laminating body 20 is reduced and heat radiating performance can be further improved.

Embodiment 2

Figure 6:
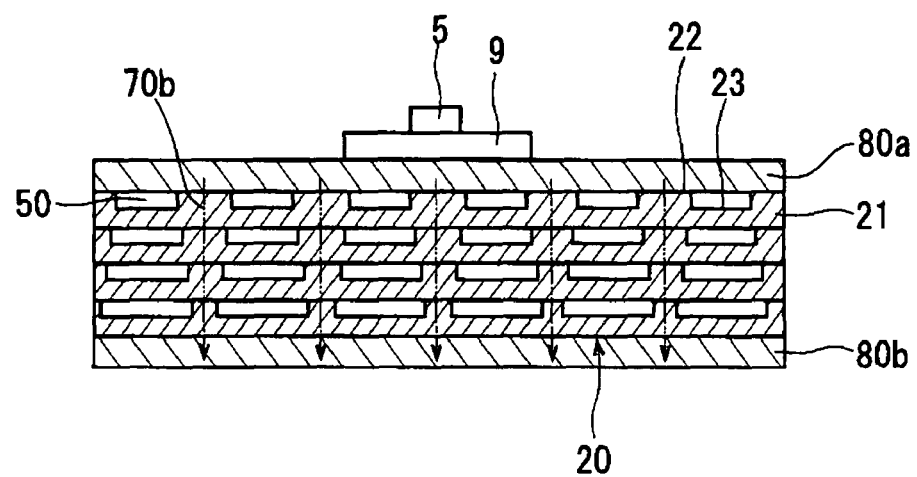
FIG. 6 is a typical sectional view of the laminating body relating to a heat sink for a power module of embodiment 2.

In a heat sink for a power module of embodiment 2, a laminating body 20b shown in FIG. 6 is adopted instead of the laminating body 20 of the heat sink 1 for a power module of embodiment 1. The other constructions are similar to those of the heat sink 1 for a power module of embodiment 1, and their explanations are therefore omitted.

In the laminating body 20b, a heat transfer path 70b is formed such that a heat transfer area is gradually reduced from the front face side. Therefore, each parallel flow path 50 is set to be increased in section as each parallel flow path is located on the rear face side.

In the heat sink for a power module of embodiment 2 having such a construction, heat generated by the power device 5 can be efficiently radiated to the cooling medium by each parallel flow path 50 gradually increased in section while this heat is efficiently transmitted from the front face of the laminating body 20 to the rear face by the heat transfer path 70b gradually reduced in heat transfer area. Therefore, this heat sink for a power module can further improve heat radiating performance.

Embodiment 3

Figure 7:
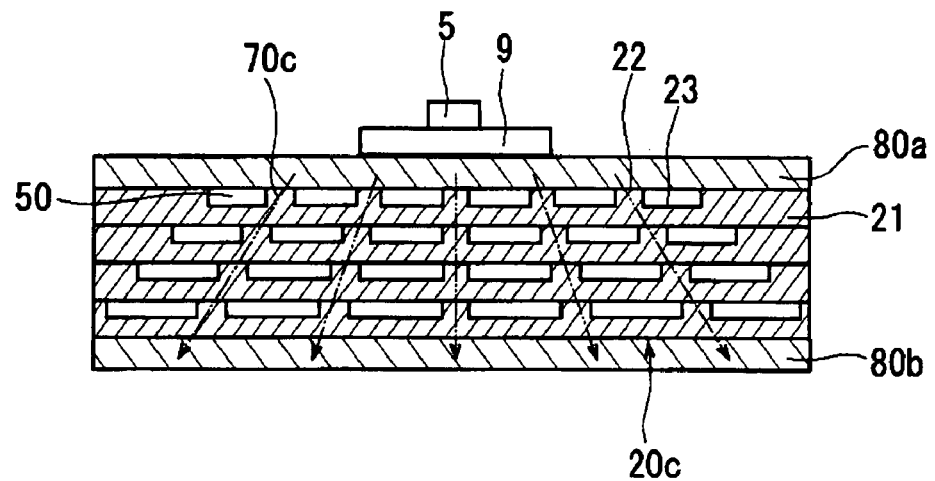
FIG. 7 is a typical sectional view of the laminating body relating to a heat sink for a power module of embodiment 3.

In a heat sink for a power module of embodiment 3, a laminating body 20c shown in FIG. 7 is adopted instead of the laminating body 20 of the heat sink 1 for a power module of embodiment 1. The other constructions are similar to those of the heat sink 1 for a power module of embodiment 1, and their explanations are therefore omitted.

In the laminating body 20c, a heat transfer path 70c is arranged in plural columns in a radiating shape from the power device 5 side mounted to the front face side to the rear face side.

In the heat sink for a power module of embodiment 3 having such a construction, heat generated by the power device 5 can be efficiently transmitted to the entire laminating body 20 by the heat transfer path 70c of the plural columns arranged in the radiating shape. Therefore, this heat sink for a power module can further improve heat radiating performance. In the heat transfer path 70c, it is preferable that the power device 5 is set to a base point and the heat transfer path 70c is formed in the radiating shape so as to lie within a range of 0 to 45° from the base point to perpendicularity.

Embodiment 4

Figure 8:
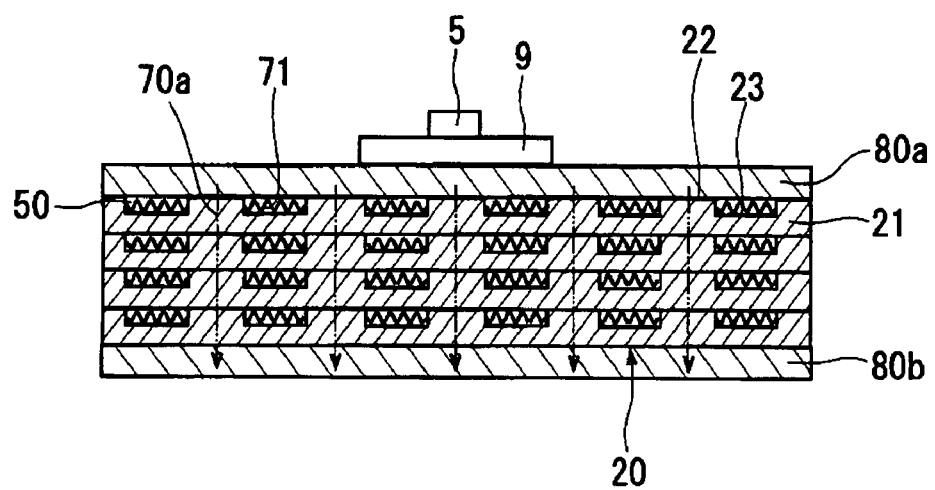
FIG. 8 is a typical sectional view of the laminating body relating to a heat sink for a power module of embodiment 4.

In a heat sink for a power module of embodiment 4, as shown in FIG. 8, a fin 71 extending in a longitudinal direction is arranged within each groove 23 of each flow path plate 21 constituting the laminating body 20 of the heat sink 1 for a power module of embodiment 1. This fin 71 is a corrugated fin bent such that a thin plate of aluminum, etc. is corrugated. The other constructions are similar to those of the heat sink for a power module of embodiment 1, and their explanations are therefore omitted.

In the heat sink for a power module of embodiment 4 having such a construction, an area coming in contact with the cooling medium can be greatly increased by the fin 71, and heat radiating performance can be further improved.

Embodiment 5

Figure 9:
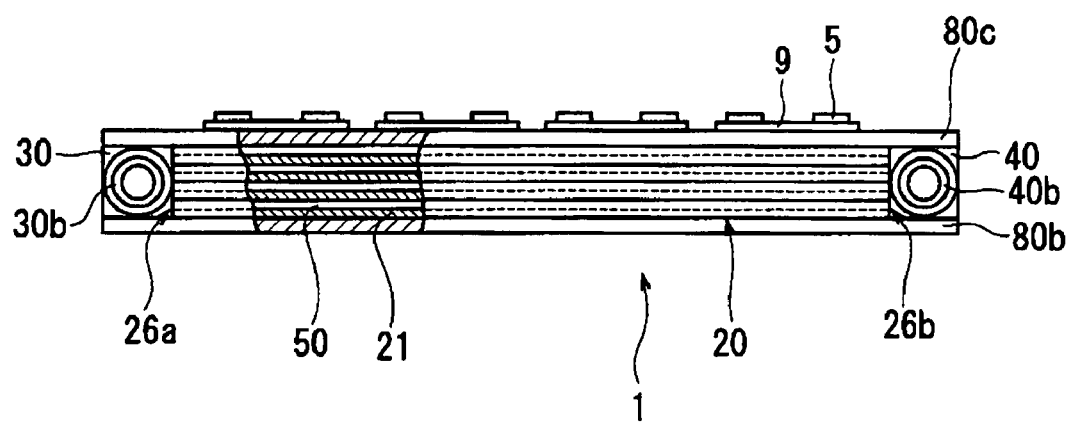
FIG. 9 is a schematic front view (partial sectional view) of a heat sink for a power module of embodiment 5.
Figure 10:
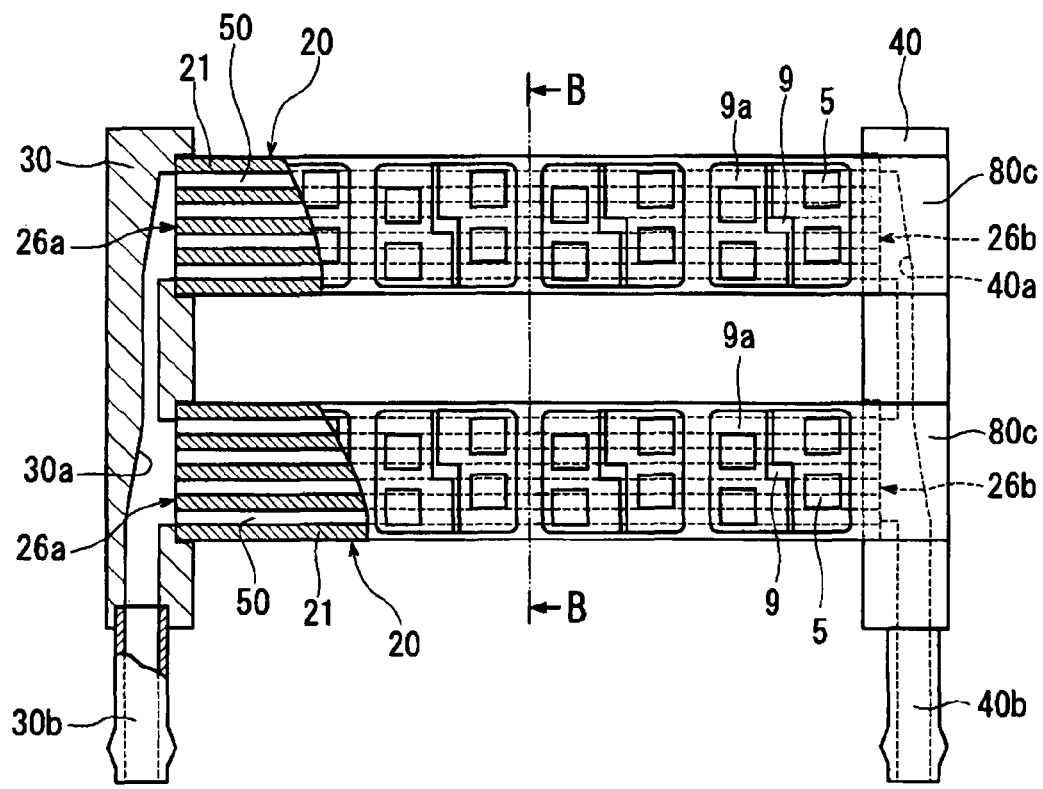
FIG. 10 is a schematic top view (partial sectional view) of the heat sink for a power module of embodiment 5.
Figure 11:
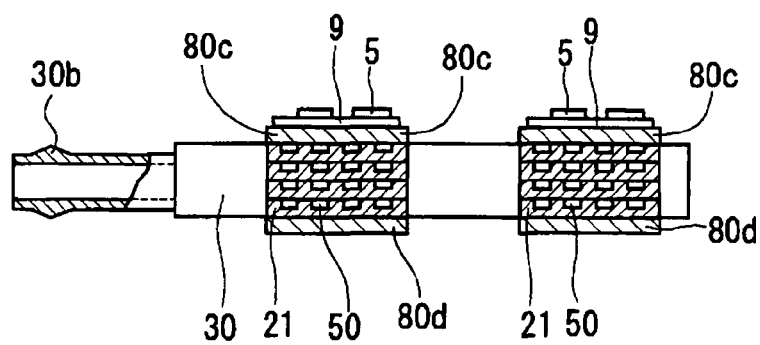
FIG. 11 is a schematic side view relating to the heat sink for a power module of embodiment 5, and showing section B-B of FIG. 10.

As shown in FIGS. 9 to 11, in a heat sink 2 for a power module of embodiment 5, the spacer block 60 of the heat sink for a power module of embodiment 1 is removed. The other constructions are similar to those of the heat sink 1 for a power module of embodiment 1, and their explanations are therefore omitted.

In the heat sink 2 for a power module of embodiment 5, as shown in FIG. 10, two laminating bodies 20 are arranged so as to be spaced in parallel. Surface plates 80c, 80d are overlapped on the front face side and the rear face side of the two laminating bodies 20. A first side plate 30 and a second side plate 40 are abutted on a side face 26a of one end side of the laminating body 20 and a side face 26b of the other end side, and are then entirely integrated, and are set to the heat sink 2 for a power module.

In the heat sink 2 for a power module of embodiment 5 having such a construction, the power device 5 is mounted to the surface of the laminating body 20 through an insulating circuit substrate 91 of plural small areas and is set to the power module. In this case, the power device 5 is wired to a wiring layer 91a of the surface of the insulating circuit substrate 91 by wire bonding, etc. For example, this power module is also applied to a hybrid car, etc., and heat radiating performance is shown similarly to the case of embodiment 1.

Here, the heat sink 2 for a power module of embodiment 5 has about the same construction as the heat sink 1 for a power module of embodiment 1. Accordingly, a further improvement of heat radiating performance and a further improvement of a mounting property can be realized. In addition to this, the spacer block 60 is removed in the heat sink 2 for a power module of embodiment 5. Accordingly, heat is also transmitted from the circumference of the laminating body 20 to an atmosphere, and heat radiating performance can be further improved. Further, the mounting property can be further improved by light weight formation and compact formation.

In the above description, the present invention has been explained in conformity with embodiments 1 to 5, but is not limited to the above embodiments 1 to 5. The present invention can be suitably changed and applied in the scope not departing from its gist.

INDUSTRIAL APPLICABILITY

The present invention can be utilized in the heat sink for a power module.

The invention claimed is:

1. A heat sink for a power module in which a power device is mounted to at least one face, and heat from said power device is radiated by a cooling medium circulated within a refrigerant flow path arranged in the interior, said heat sink comprising:
a laminating body in which plural flow path plates formed in a plate shape and concavely arranging plural grooves parallel to each other on a flat joining face are arranged, and each groove is set to a parallel flow path parallel to said one face by laminating each flow path plate by each joining face, and a portion other than each groove of each joining face forms a heat transfer path to each parallel flow path of the laminating direction, said heat transfer path is formed such that a heat transfer area is gradually reduced from said one face side;
a first side plate joined to a side face of one end side of said laminating body and communicated with one end of each parallel flow path, and forming a flow-in path for flowing said cooling medium into each parallel flow path; and
a second side plate joined to a side face of the other end side of said laminating body and communicated with the other end of each parallel flow path, and forming a flow-out path for flowing said cooling medium out of each parallel flow path; and
said refrigerant flow path is constructed by the flow-in path, each parallel flow path and the flow-out path,
wherein a flow-in hole is mounted on the first side plate such that the flow-in hole communicates with the flow-in path and projects in a direction in which the plural grooves on each of the flow path plates are aligned parallel to each other, and
wherein a flow-out hole is mounted on the second side plate such that the flow-out hole communicates with the flow-out path and projects in a direction in which the plural grooves on each of the flow path plates are aligned parallel to each other.

2. The heat sink for a power module according to claim 1, wherein plural through holes passing through a bottom face of said each groove and communicating said each parallel flow path of the laminating direction are formed in said each flow path plate.

3. The heat sink for a power module according to claim 2, wherein said each through hole is shifted in the laminating direction.

4. The heat sink for a power module according to claim 2, wherein said each through hole is formed so as to guide said cooling medium in the laminating direction.

5. The heat sink for a power module according to claim 1, wherein said each flow path plate is formed by at least press molding, cutting processing, extrusion molding or roll forming.

6. The heat sink for a power module according to claim 1, wherein a fin extending in a longitudinal direction is arranged within said groove.

* * * * *